United States Patent [19]

Minami

[11] Patent Number: 5,124,273
[45] Date of Patent: Jun. 23, 1992

[54] AUTOMATIC WIRING METHOD FOR SEMICONDUCTOR INTEGRATED CIRCUIT DEVICES

[75] Inventor: Fumihiro Minami, Yokohama, Japan

[73] Assignee: Kabushiki Kaisha Toshiba, Kawasaki, Japan

[21] Appl. No.: 691,613

[22] Filed: Feb. 27, 1991

Related U.S. Application Data

[63] Continuation of Ser. No. 372,907, Jun. 29, 1989, abandoned.

[30] Foreign Application Priority Data

Jun. 30, 1988 [JP] Japan ................. 63-160782

[51] Int. Cl.⁵ ............... H01L 21/70; G06F 15/60
[52] U.S. Cl. ................................ 437/51; 357/45; 364/491
[58] Field of Search .................... 437/51; 357/45; 364/490, 491

[56] References Cited

U.S. PATENT DOCUMENTS

| | | | |
|---|---|---|---|
| 4,636,965 | 1/1987 | Smith et al. | 364/491 |
| 4,823,276 | 4/1989 | Hiwatashi | 364/491 |
| 4,823,278 | 4/1989 | Kikuchi | 364/491 |
| 4,839,820 | 6/1989 | Kinoshita | 364/491 |
| 4,839,821 | 6/1989 | Muralcata | 364/491 |
| 4,910,680 | 3/1990 | Hiwatashi | 364/490 |
| 4,965,739 | 10/1990 | Ng | 364/490 |

FOREIGN PATENT DOCUMENTS 0073642 4/1988 Japan.
0089445 4/1989 Japan.

OTHER PUBLICATIONS

1982 IEEE, "Optimum Placement of Two Rectangular Blocks", M. Chandrasekhar and M. Breuer, 19th Design Automation Conference, Paper 46.6, pps. 879-886.

*Primary Examiner*—Tom Thomas
*Attorney, Agent, or Firm*—Oblon, Spivak, McClelland, Maier & Neustadt

[57] ABSTRACT

A computer-assisted automatic wiring method is presented for logic LSI substrates wherein channel boundary terminals are defined on the boundary line of the first and second channels forming a T-shaped crossing region between the function blocks arranged on a substrate after global wiring process. These channel boundary terminals are roughly divided into the first and second terminal groups there may remain channel boundary terminals which do not belong to any one of the groups. The first terminal group includes terminals intersecting wirings which tend to run along the first direction in the second channel, which corresponds to a top bar of the letter "T". The second terminal group includes terminals intersecting wirings which have tend to run along the second direction opposite to the first direction in said second channel. A pair of channel boundary terminals is sequentially selected from the first and second groups. Typically, the same wiring track is assigned to two wirings associated with the selected each pair of terminals in the second channel.

15 Claims, 7 Drawing Sheets

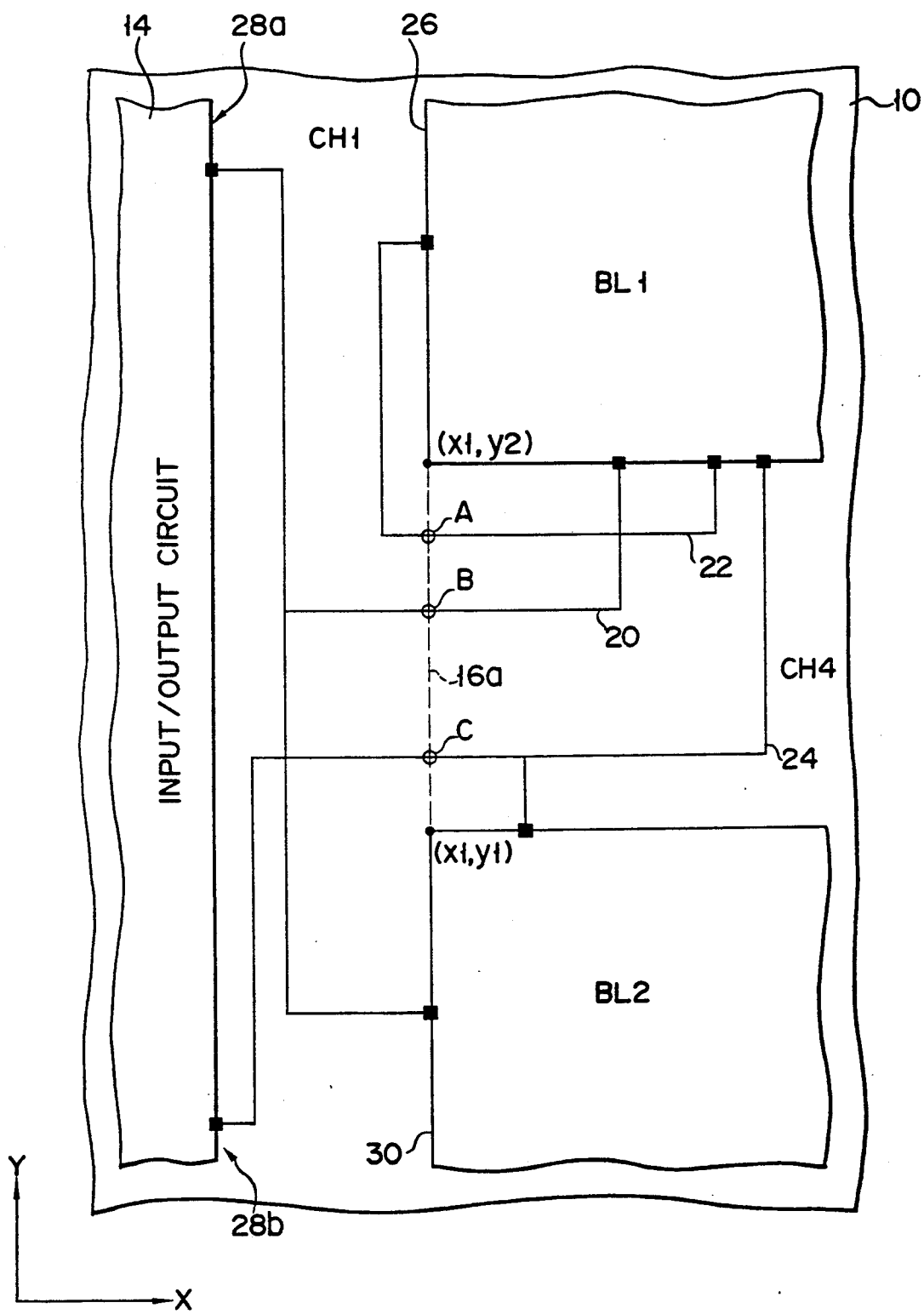
F I G. 3

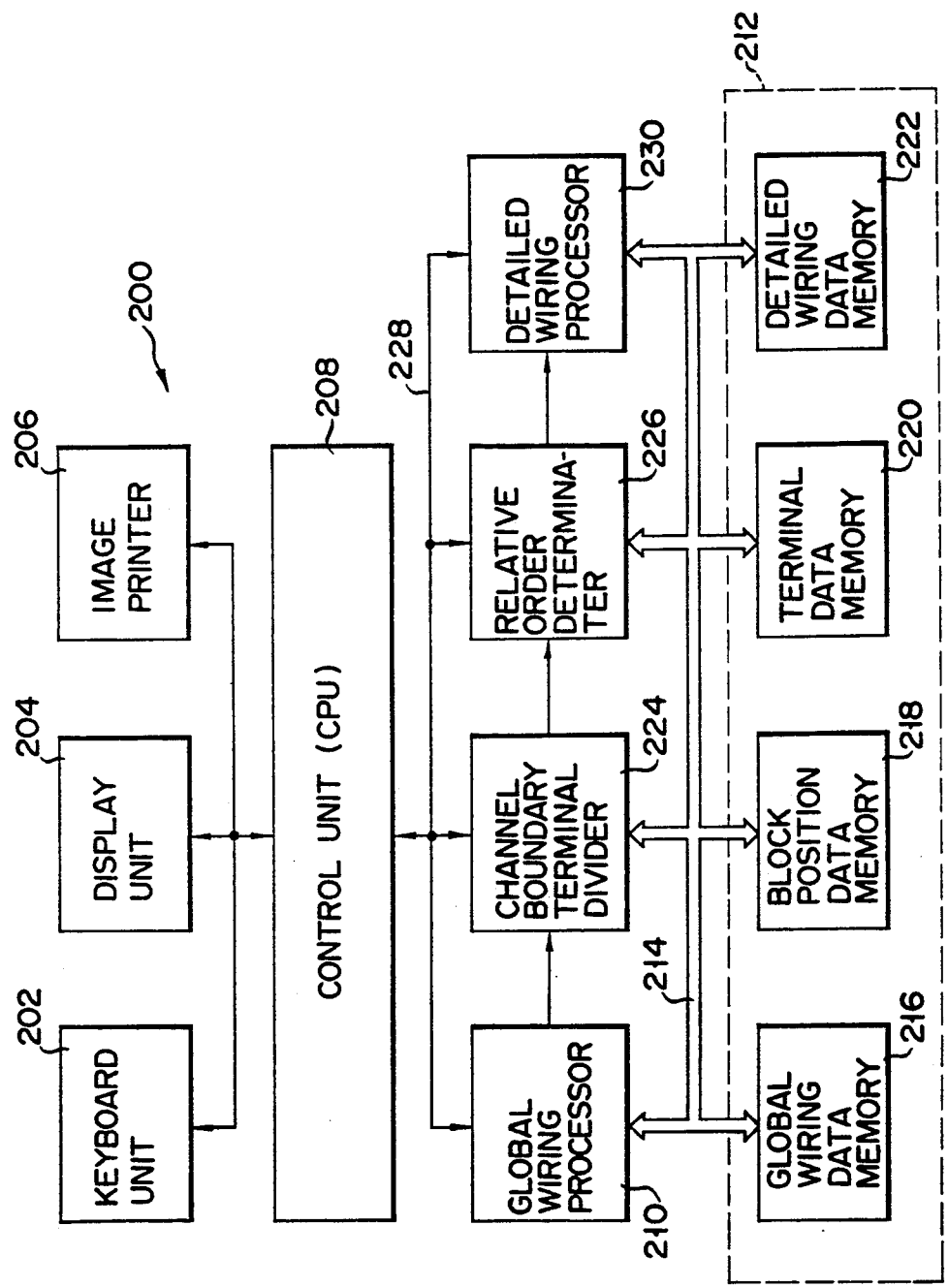
F I G. 5

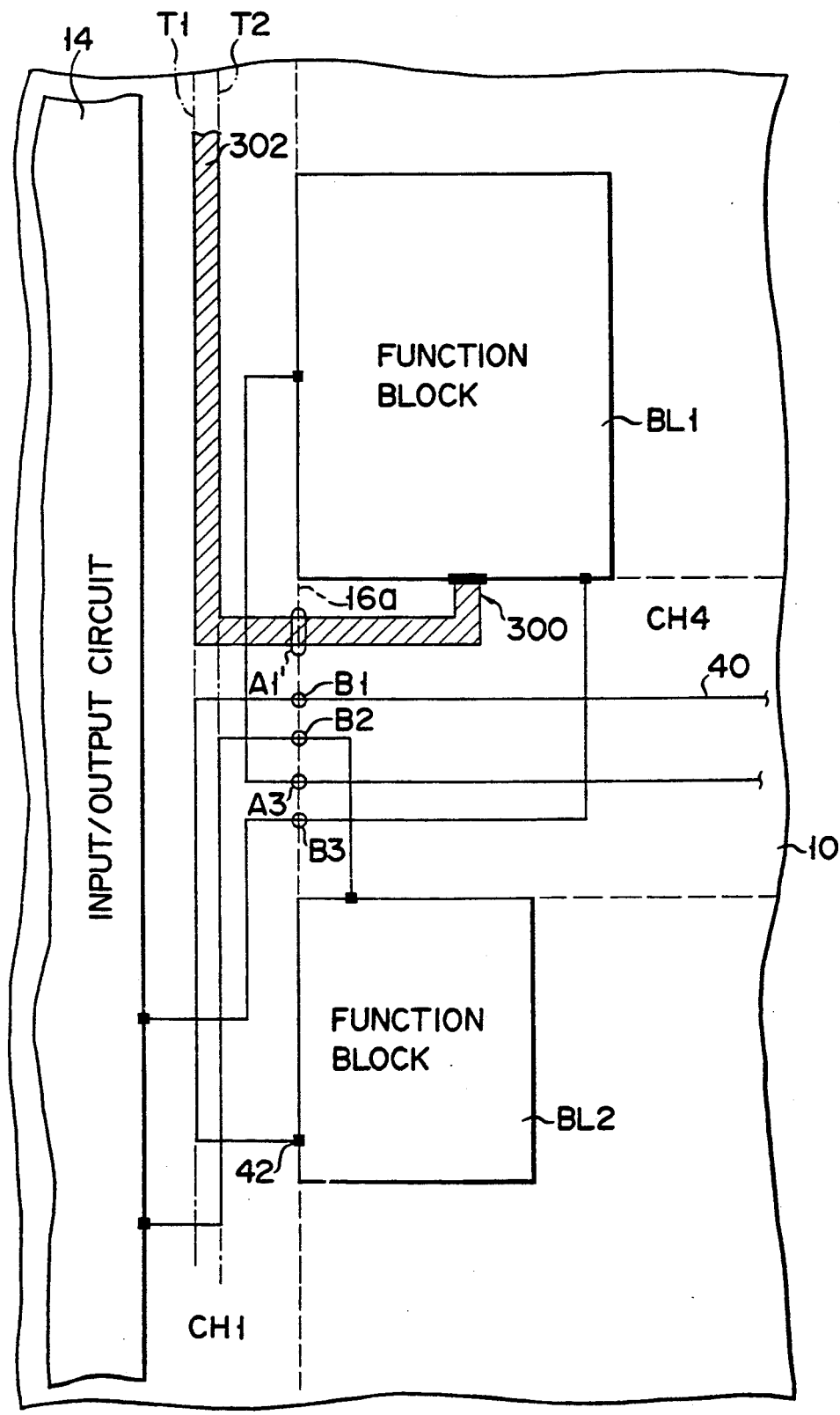
F I G. 6

AUTOMATIC WIRING METHOD FOR SEMICONDUCTOR INTEGRATED CIRCUIT DEVICES

This is a continuation of application Ser. No. 07/372,907, filed on Jun. 29, 1989, now abandoned.

BACKGROUND OF THE INVENTION

1. Field of the Invention

The present invention relates to an automatic wiring technique of semi-custom semiconductor integrated circuit devices and, more particularly, to the method and device for designing automatic wiring patterns which are formed with the assistance of a computer in accordance with a predetermined routing scheme between function circuit blocks which are selected to realize a desired LSI circuit function on a chip substrate.

2. Description of the Related Art

Unlike a full-custom LSI (large scale integrated circuit), the importance of the semi-custom LSI has been increased to the semiconductor manufactures in recent years for reasons of the short developing period of time, superiority in flexibility for realizing various use of LSI, and relatively low cost of products. A building-block type or general-cell type LSI is one of typical semi-custom LSIs wherein selected function blocks (also called "modules") such as a CPU (central processing unit), an ALU (arithmetic logic unit), a PLA (programmable logic array), a RAM (random access memory), a ROM (read only memory), or polycell unit are dispersively arranged on a semiconductor chip substrate. An appropriate wiring pattern forming of line segments extending in the row and column directions (X and Y directions) of the the substrate is added into a wiring region defined between these function blocks to surround these function blocks, and an electrical wiring is provided between the function blocks, thereby providing a desired LSI function.

Normally, according to this kind of semi-custom LSI, a computer-assisted routing design method is used to determine a wiring pattern, for the electrical connection between the above blocks. For example, in a case when the channel wiring method is used for designing the wiring pattern, the wiring region of the substrate surface is divided into sub-wiring regions (known as "channels" among one skilled in the art) to correspond to the function blocks arranged on the substrate. In general, each function block has a rectangular plane shape, each channel is also defined to have a rectangular plane shape to be adjacent to the corresponding function block. Therefore, the channel regions, which are adjacent to each other on the substrate, are interconnected to each other via a linear boundary line. The number of wires (number of tracks) running in the directions of the row and column, which can be formed in each channel, is determined in accordance with an area of each channel. In order to satisfy the condition of the number of said tracks, and minimize the length of each wire at the same time, the wiring patterns, which is necessary to realize a desired LSI function, are respectively determined every channel through a rough wiring path (global wiring path) determination step and a detailed wiring process step.

For example, the wiring pattern design of the corresponding channel between a certain function block and the function blocks associated therewith is performed in such a manner that the terminals of the function blocks are correctly connected to the corresponding terminals of the opponent function blocks, respectively. In this case, in consideration of the condition of the allowable number of tracks, it is common that each connection line is formed of line segments running in the directions of the row and column. Firstly, a global wiring path is determined, and a detailed wiring process is performed. In a boundary line between the channel to be processed and the channel adjacent thereto, virtual or pseudo terminals (generally called "channel boundary terminals" or "channel boundary pins") are provided in accordance with the connection requirement between these function blocks. If the determination of the wiring pattern of one channel is completed, the wiring patterns of the other channel adjacent thereto are determined in the same manner.

According to the conventional automatic wiring design method, however, there is a problem that the resultant integration density of LSI cannot be expected to be highly improved as required. This is because the redundant crossing of wiring lines is generated in the vicinity of the boundary between the adjacent channels. Such a redundant wire crossing leads to generation of unnecessary spaces in the channels; the channel width is undesirably increased.

SUMMARY OF THE INVENTION

It is therefore an object of the present invention to provide a new and improved automatic wiring technique for a semiconductor integrated circuit, which can facilitate an effective use of a channel area for the wiring between the function blocks, thereby largely contributing to the improvement of the integration density of the semiconductor integrated circuit.

In accordance with the above object, the present invention is addressed to a specific automatic wiring method for the semiconductor integrated circuit device wherein function blocks selected to realize the desirable logical functions are arranged on the substrate, and the channels serving as wiring regions are defined around the function blocks. After global wirings necessary to the function blocks are provided in the channels, crossing points between the wirings and boundary lines of these channels are detected. The detected crossing points are defined as "channel boundary terminals". Next, a certain pair of two neighboring channels, which are coupled with each other so as to form a "T" shaped crossing region, are defined from these channels. The two neighboring channels consists of a first channel which is positioned between at least two corresponding function blocks, and a second channel which is in contact at a boundary line with the first channel substantially at right angle thereby to form the "T" shaped crossing region. Sequentially, the above channel boundary terminals, which are defined on the boundary lines, are divided into the first and the second terminal groups. The first terminal group includes terminals intersecting the wirings which tend to run along the first direction in a second channel corresponding to a top bar of the letter "T". The second terminal group includes terminals intersecting the wirings which tend to run along the second direction opposite to the first direction in a second channel. A pair of channel boundary terminals are sequentially selected from these first and second groups, respectively. In the second channel, wiring tracks are assigned to wirings associated with pairs of selected channel boundary terminals in said second channel in such a manner that each of said tracks is basically occupied with two wirings running thereon in the opposite directions to each other.

The present invention and its objects, and advantages will become more apparent from the detailed description of the preferred embodiment of the present invention presented below.

BRIEF DESCRIPTION OF THE DRAWINGS

In the detailed description of a preferred embodiment of the present invention presented below, reference is made to the accompanying drawings of which:

FIG. 3 is a partially enlarged view of the substrate of FIG. 1;

FIG. 5 is a diagram schematically showing the entire structure of the device executing the automatic wiring process of the present invention shown in FIGS. 2A and 2B; and FIG. 6 is a diagram showing a modification of the wiring process method of the present invention.

DETAILED DESCRIPTION OF THE PREFERRED EMBODIMENT

Figure 1:
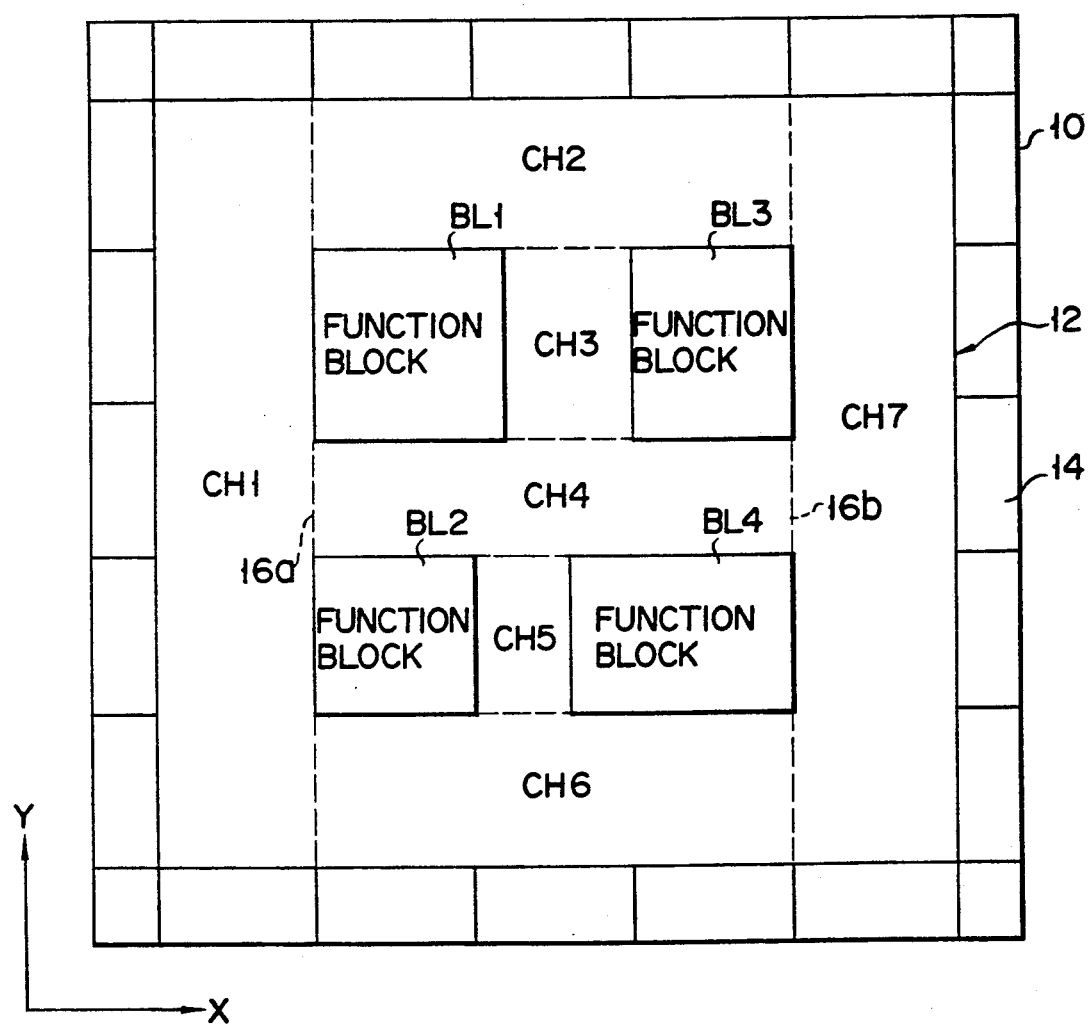
FIG. 1 is a diagram schematically showing a plan view of a building block type semi-custom logic LSI chip according to one preferred embodiment of the present invention.

In FIG. 1, the building block type logic LSI chip substrate is designated by reference numeral "10" in accordance with one preferred embodiment of the present invention. The chip substance 10 comprises a main circuit region 12, which is defined in the central portion of the rectangular top surface, and input/output circuit region 14, which is defined in the peripheral portion of a substrate 10 to surround the region 12.

In the main circuit region 12, selected various function blocks BL1, BL2, BL3, and BL4 are arranged to realize a customer's desired LSI function. In the example of FIG. 1, only four functions blocks are drawn in order to simplify the drawing; however, in actual, a greater number of function blocks will be dispersively arranged in the main circuit region 12. These function blocks BL1 to BL4 may include a CPU (central processing unit), an ALU (arithmetic logic unit), a PLA (programmable logic array), a ROM (random access memory), and/or a ROM (read only memory) in accordance with the required LSI function. Alternatively, these function blocks BLs may be formed of polycell.

In the main circuit region 12 of the substrate 10, the surface region remaining around the function blocks BL serves as a wiring region for providing the wirings, which electrically connect between the terminals of these function blocks BL. Therefore, an appropriate wiring pattern forming of line segments extending in the row and column directions (X and Y directions) of the the substrate 10 is added into the wiring region, thereby providing a desired LSI function on the chip substrate 10.

The wiring region is divided into a plurality of subwiring regions each of which has a rectangular planar shape in accordance with the planar dispersive arrangement of the function blocks BL1 to BL4. These subwiring regions are called "channels" hereinafter. According to the embodiment, as shown in FIG. 1, seven channels CH1, CH2, . . . , CH7 are defined around four function blocks BL1 to BL4. These channels CH are directly in connect with each other via a block boundary line, which is also called "envelops", shown by a dotted line. For example, channel CH1, which extends along Y direction, is in contact with channel CH 4, which extends along x direction, via a boundary line 16a.

Each function block BLi (i=1, 2, . . . ) has signal input/output terminals to be connected to the other function block or function blocks: FIG. 1 does not illustrate such terminals, but drawings after this illustrate it. Since the interconnection between the function blocks BL associated with each other at these terminals is determined in accordance with the circuit connection based on the final LSI use which a user wishes, the realization of the connection pattern on the substrate 10 is a subject of the automatic wiring technique of the present invention. The automatic wiring process will be explained with reference to a flowchart shown in FIGS. 2A and 2B as follows.

Figure 2A:
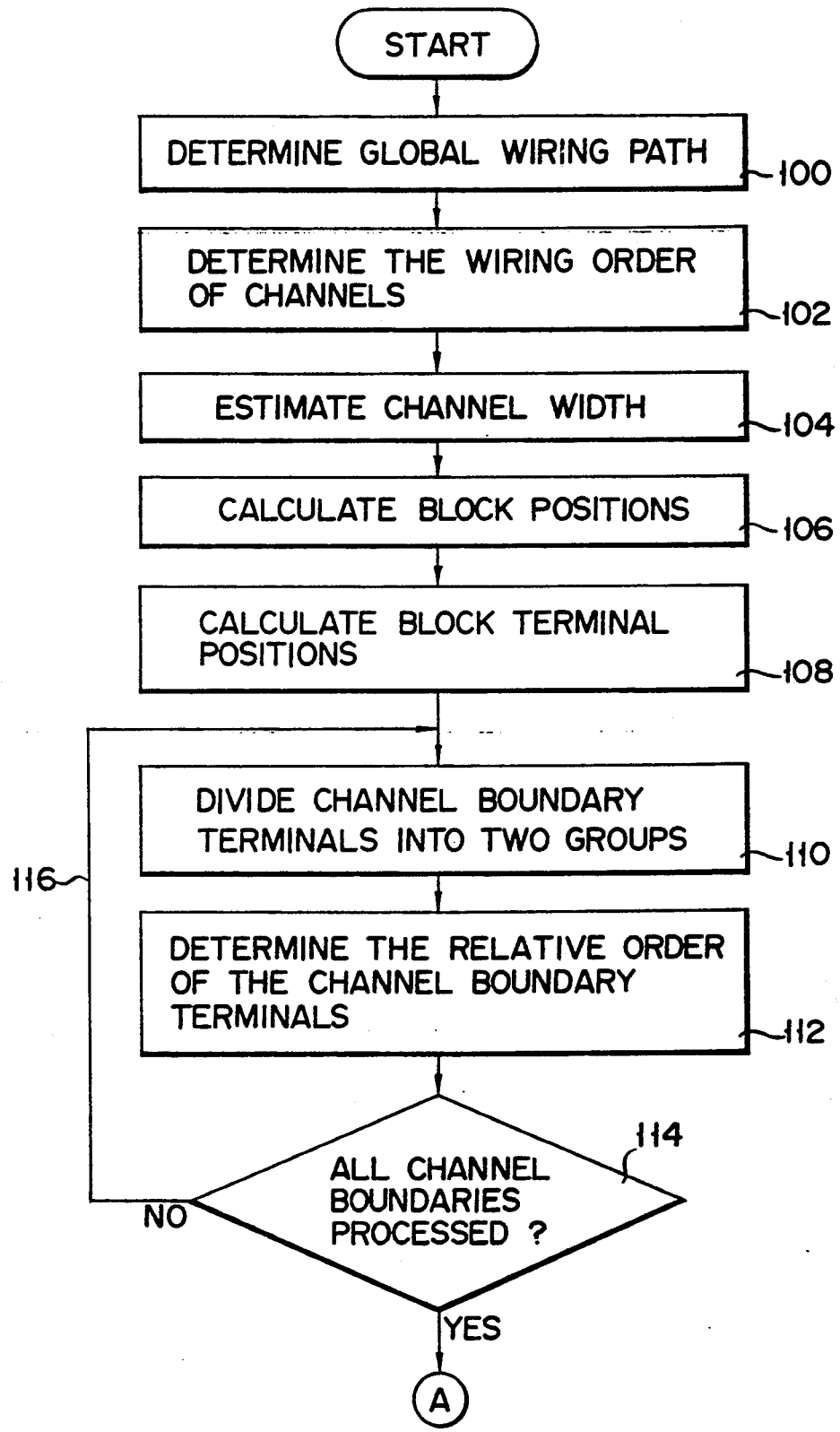
FIGS. 2A and 2B are diagrams showing a flowchart of main processes of an automatic wiring method of the present invention.

As shown in FIG. 2A, the automatic wiring process of this invention begins at step 100 with a global wiring path determination, wherein it is roughly determined to which channel CHi each of the wirings connected between the function blocks BL is assigned. After the passing channel CHi of each wiring is determined, points where the wirings, which passing two neighboring channels CH, cross the boundary line 16 between these channels CH, are detected. These crossing points are called "channel boundary pins" or "channel boundary terminals", which, for example, are designated by reference numerals A, B, and C of FIG. 3.

At step 102 in FIG. 2A, the order (wiring process order) of which the channels CH1 to CH7 between the function blocks BL are subjected to the wiring process is determined. The appropriate wiring order of the channels CH may be automatically determined in accordance with the positional relationship among the channels. The determination of the wiring process order itself is well-known, for example, as shown in U.S. patent application Ser. No. 026,301 (Tamotsu HIWATASHI) filed on Mar. 16, 1987, page 9, line 6 to page 10, line 7.

Subsequently, at step 104 in FIG. 2A, the degree of congestion of wirings is calculated every channel CHi based on the provisonal wiring path (global wiring path) as determined above. The necessary width of the corresponding channel is estimated from the calculated value of the degree of congestion. In this case, since the relationship between the value of the degree of congestion of wirings and the width of the channel are quantitatively determined by empirical formula which is formed base on data accumulated in the past, the estimation of the width of each channel may be relatively easily performed.

At step 106 in FIG. 2A, by the use of the estimated value of every channel width as determined above, the positions where function blocks BL1 to BL4 are placed on chip substrate 10 are calculated. As a result, appropriate arrangement and positioning of the function blocks BL can be made while the channel width necessary to provide the wiring pattern having the wiring path roughly determined are maintained therebetween.

At step 108 in FIG. 2A, by the use of an X-Y coordinate system of substrate 10, the positional coordinations of connection terminals of all function blocks BL are calculated. The connection terminals includes signal input terminals, signal output terminals, power source terminals, etc. For example, the point of the bottom left of the substrate 10 is used as an original point of the above X-Y coordinate system, and each coordinates (xi, yi) of the connection terminals is calculated every function block. In this case, the accuracy of the calculated coordinates will be fine if it is obtained to the extent that the channel boundary terminals can be discriminated from each other in dividing the channel boundary terminals into groups in a next step.

The feature of the automatic wiring process of this invention lies in having a series of wiring rearranging processes which begins at step 110 in FIG. 2A. At step 110, the channel boundary terminals accompanying a specific channel boundary line are divided into a first and second groups. More specifically, in each couple of two neighboring channels as shown in FIG. 1, the specific pair of channels, which are connected in a T-shaped manner, is designated. Typically, as shown in FIG. 3, a pair of channel CH4, which is defined between function blocks BL1 and BL2, and channel CH1, which intersects channel CH4 and connected thereto to be T-shaped, is designated.

In FIG. 3, the connection terminals of function blocks BL1 and BL2 are designated by a mark " " just for the sake of convenience of the drawing. By the above global wiring pattern determination, wirings 20, 22, and 24 are provided between function blocks BL1 and BL2 and input/output circuit 14. At the crossing point of boundary line 16a between channels CH1 and CH4, channel boundary terminals A, B, and C are defined. It is assumed that the coordinates of the upper end of the channel boundary line 16a (that is, the corner point of the lower left of function block BL1) are (x1, y2) and the coordinates of the lower end of the channel boundary line 16a (that is, the corner point of the upper left of the function block BL2) are (x1, y1).

Under such a condition, the channel boundary terminals A, B, and C of the T-shaped connected channels CH1 and CH2 are divided into the first and second terminal groups according to the following conditions:

Nu: Channel boundary terminals which are connected by signal wiring lines to those terminals which are positioned in the elongated channel CH1 extending along Y direction and each of which has a Y-coordinate value Yt being equal to or larger than y2 ($Yt \geq y2$) and being smaller than y1 ($Yt < y1$), the above defined terminals being connection terminals or channel boundary terminals on a boundary line defined between channel CH1 and a channel neighboring thereto and not visible in FIG. 3. These channel boundary terminals are included in the first group.

Nd: Channel boundary terminals which are connected by signal wiring lines to those terminals which are positioned in channel CH1 direction and each of which has a Y-coordinate value Yt being equal to or smaller than y1 ($Yt \leq y1$) and being larger than y2 ($Yt < y2$), the above defined terminals being connection terminals or channel boundary terminals on a boundary line defined between channel CH1 and a channel neighboring thereto and not visible in FIG. 3. These channel boundary terminals are included in the second group.

In other words, the channel boundary terminals to belong to the first group consist of channel boundary terminals each of which has a wiring line connected to either a connection terminal on a side line 26, which is an upper extension line of channel boundary line 16a in the channel CH1, or a connection terminal on the upper half of side line 28a on input/output circuit 14 which is in contact with channel CH1. In the example of FIG. 3, channel boundary terminal A is included in the terminal group Nu constituting the first group. On the other hand, the channel boundary terminals to belong to the second group consist of channel boundary terminals, each of which has a wiring line connected to either a connection terminal on a side line 30 which is a lower extension line of channel boundary line 16a of function block BL2 in the channel CH1, or a connection terminal on the lower half of side line 28b on input/output circuit 14 which is in contact with channel CH1. In the example of FIG. 3, channel boundary terminal C is included in the terminal group Nd constituting the second group.

In the grouping process of the above channel terminals of the selected pair of two neighboring channels, there may be a channel boundary terminal which is difficult to be immediately determined to belong to any one of the first and the second terminal group defined under the above division condition. In the example of FIG. 3, terminal B corresponds to this case. It should be noted that the coordinate system to be used may be rotated at 90° and the same process as the above may be carried out in a case when the channel boundary line is a horizontal line.

Sequentially, at step 112 in FIG. 2A, one channel boundary terminal is selected from the first and second groups Nu and Nd, respectively, and a pair of channel boundary terminals is extracted. More specifically, one channel boundary terminal nu is arbitrarily selected from the channel boundary terminals constituting the first group Nu and one channel boundary terminal is arbitrarily selected from the channel boundary terminals constituting the second group Nd. These selected channel boundary terminals nu and nd constitute the pair of the selected channel boundary terminals. In the pair of the above terminals, the relative positional ordering process is performed in such a manner that terminal nu is located at the relatively upper position with respect to the other terminal nd on the boundary line 16a. Sequentially, another channel boundary terminal is selected from the first group Nu, if any; at the same time, another channel boundary terminal is selected from the second group Nd. At this time, in a case when no channel boundary terminal to be selected in either first or second group, the above selecting process is stopped. In other words, the selection of the channel boundary terminal from the first and second groups is continued until no selection element exists in either one of first and second groups. For example, in FIG. 3, terminal A is first selected from the first group Nu, whereas terminal C is selected from the second group Nd, thereby to determine the terminal pairs A and C. Since terminal A should be located at the upper position than terminal C on boundary line 16a, the positional order thereof is unchanged as shown in the drawing. It should be noted in step 112 that the coordinate system to be used may be rotated at 90° and the same process as the above may be carried out in a case when the channel boundary line is a horizontal line.

Figure 2B:
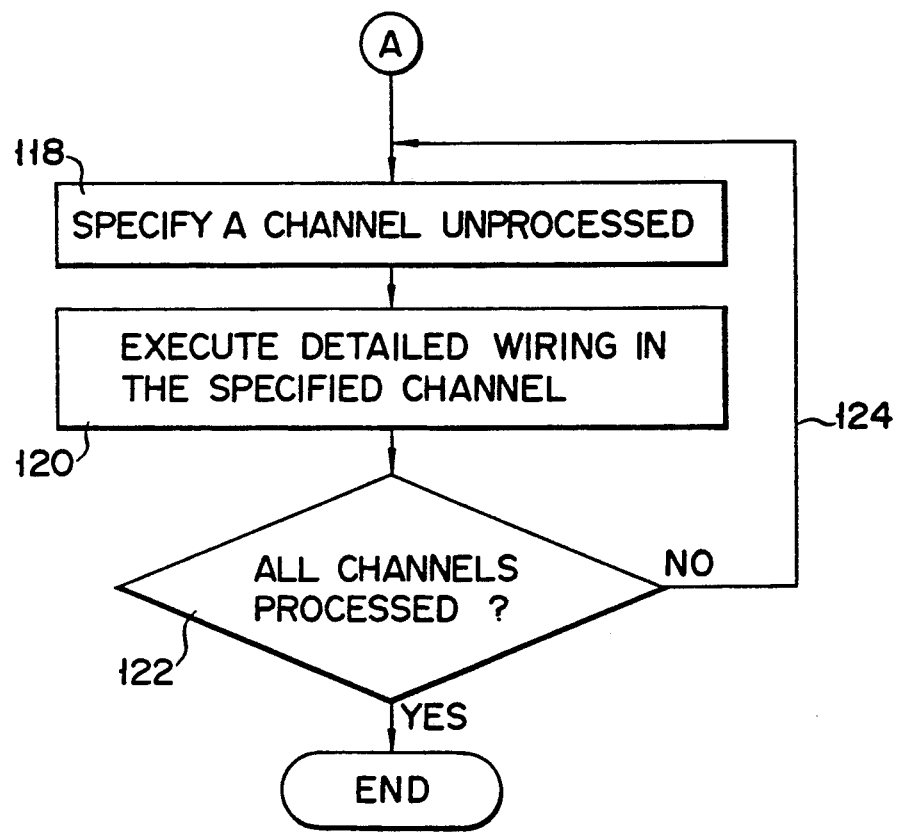

Sequentially, at step 114 in FIG. 2A, it is determined (judged) whether or not steps 110 and 112 are completed relating to all channel boundary lines. If it is determined that these steps are completed, the processing operation advances to a specified wiring process step as shown in FIG. 2B. In a case when these steps are not completed, it returns to the above process step 110 in accordance with an arrow 116 and the same process as the above is made to another boundary line.

At step 118 in FIG. 2B, one unprocessed channel CHi is designated from channels CH1 to CH7 on the substrate 10. Sequentially, at step 120, the designated Channel CHi is subjected to the detailed wiring process. The process order of the channels CH where the specified wiring process is carried out depends on the wiring order determined at step 102. At step 122 in FIG. 2B, it is determined whether or not the above-mentioned detailed wiring steps 118 and 120 relating to all channels CH are completed. If these steps are completed, the automatic wiring process is terminated. If these steps are not completed, the processing operation returns to the process step 118 in accordance with an arrow 124 and the detailed wiring process is made to a next specified channel CHi+1 similar to the above-mentioned detailed wiring process.

The basic process flow of the automatic wiring process of the present invention will be explained in more detailed by the use of more specific example of wiring shown in FIG. 4. In a partially enlarged plane view of FIG. 4, the same reference numerals as FIG. 3 are added to the same portions as FIG. 3, and the detailed explanation is omitted to avoid the redundant descriptions.

Figure 4:
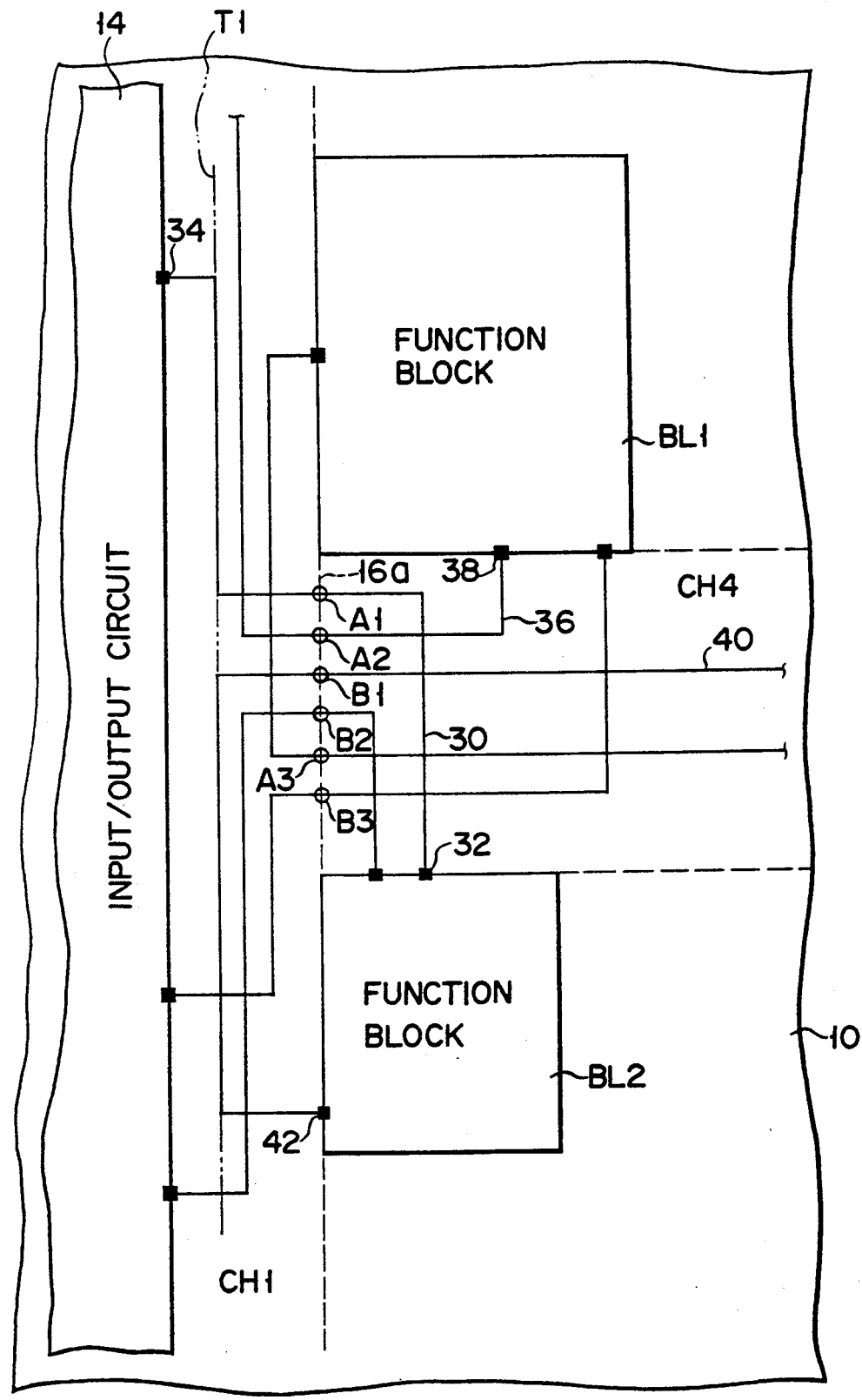
FIG. 4 is a diagram showing an enlarged main plane structure of the substrate, in which an actual wiring process is performed.

As shown in FIG. 4, boundary line 16a is defined between channel CH4, which is defined between function blocks BL1 and BL2, and channel CH1 intersecting channel CH4. The channel boundary line 16a intersects six wiring lines; therefore, six channel boundary terminals are formed on the boundary line 16a. The grouping processes (see steps 110 and 112) of these channel boundary terminals will be explained in detail as follows.

As shown in FIG. 4, six channel boundary terminals on the boundary line 16a is divided into the first group Nu consisting of terminals A1, A2 and A3 and the second group Nd consisting of terminals B1, B2, and B3 according to the above-mentioned condition. Terminals A1 to A3 included in the first group Nu are the terminals to be connected to the opponent connection terminals in the upper half region of channel CH1. For example, channel boundary terminal A1 is the terminal with which a wiring line 30 is intersected: the wiring line 30 has a connection requirement with a terminal 34 of the input/output circuit 14, which is led from a terminal 32 of function block BL2 and positioned at the upper half region of channel CH1. Channel boundary terminal A2 is the terminal with in which a wiring line 36 is intersected, this wiring having a connection requirement with a terminal (not shown in FIG. 4), which is led from a terminal 38 of function block BL1 and positioned at the upper half region of channel CH1. On the other hand, channel boundary terminal B1 is the terminal with which a wiring line 40 is crossed which is required to be connected to a terminal 42 of function block BL2 positioned at the lower half region of channel CH1. Roughly speaking, terminals A1 to A3 are the terminals with which the wirings being led from these terminals and extending in the upper direction of channel CH1 are intersected; terminals B1 to B3 are the terminals with which the wirings being led from these terminals and extending in the lower direction of channel CH1 are intersected.

Of the channel boundary terminals which are divided into the first and second groups, the relative positional ordering process as shown in step 112 in FIG. 2A is carried out. For example, when channel boundary terminal A1 is selected from the first group Nu, the corresponding boundary terminal B1 is selected from the second group Nd, thereby obtaining a pair of terminals (A1, B1). Similarly, a pair of terminals (A2, B2) and a pair of terminals (A3, B3) are defined. It should be noted in FIG. 4 that wirings associated with a certain pair of terminals (A1, B1) are illustrated to run in the same wiring track to facilitate the visual understanding. For example, in channel CH1, wirings 30 and 40, which are associated with a pair of terminals (A1, B1), belong to one track T1 and extend in the opposite direction to each other on the track T1. With such an arrangement, in the crossing region of channels CH1 and CH4 coupled in a T-shaped manner, the complicated crossing of wirings can be minimized so that the wiring pattern can be effectively assigned to the wiring track. This makes it possible to maximize the efficiency of using the wiring region, thereby largely contributing to the improvement of the integration density of the semiconductor integrated circuit.

In the above example, the channel boundary terminals were completely divided into two groups. However, the actual automatic wiring process is not always limited to such a result. If this is the case, and when terminals which do not belong to either the first group or the second group are remained, these terminals are left as they are. In other words, the channel boundary terminals are not forced to be included in either the first group Nu or the second group Nd by the grouping process. This is a secondary important feature of the automatic wiring process technique of this invention. Under such a condition, if the complete grouping division process of all channel boundary terminals is forced to be performed, the wiring pattern at channel CH4 will become rather complicated, and there is risk that undesirable increase in the width of channel CH4 will be brought about. The completion of the dividing process into the first and second groups as the undivided channel boundary terminals are left as they can minimize the risk of deteriorating the wiring of the channel CH4 and bring about efficiency of the wiring of the channel CH4.

In other words, according to the present invention, the channel boundary terminals, which are defined on a boundary line of a selected pair of two neighboring channels forming a T-shaped crossing region, are divided into two groups, Nu and Nd under the condition of the above-mentioned relaxed restriction. The division process to these groups Nu and Nd is terminated as the terminal or terminals, which do not belong to any groups, is remained as it is. Therefore, for example, in the example of FIG. 4, the number of wiring tracks of channel CH4 is equivalent to the conventional wiring process, and the number of wiring tracks in channel CH1 can be effectively minimized. Therefore, the effective use of the occupied area of the wiring pattern can surely made.

In FIG. 5, a computer-assisted apparatus, which executes an automatic wiring process method of the above-mentioned present invention, is generally designated by reference number "200". The apparatus 200 comprises a data input unit 202 for inputting data such as a desirable connection requirement, a display unit 204 for visually informing a chip wiring pattern, whose wiring is automatically designed, to an operator, and an image printer 206 for generating the wiring pattern thus designed hard copy as required. These units 202, 204, and 206 are arranged under the control of a control unit 208. The control unit 208 is constituted by the use of, for example, a central processing unit (CPU) of a minicomputer.

A global wiring processor 210 shares in execution of steps 100, 102, 104, 106, and 108 in FIG. 2A. The global wiring processor 210 is connected to data storage unit 212 via a main data bus 214. The data storage unit 212 includes four memory sections 216, 218, 220, and 222. The memory 216 stores design resultant data of the rough wiring path, which is supplied from the global wiring processor 210 therein. Calculation resultant data of the position of the function block BL is transferred from global wiring processor 210 via data bus 214 to memory 218 and stored therein. The calculated position data of the function block terminals and the channel boundary terminals are transferred from global wiring processor 210 via data bus 214 to memory 220 and stored therein The global wiring processor 210 is connected to a channel boundary terminal divider 224. The channel boundary terminal divider 214 divides the channel boundary terminals into first and second groups Nu and Nd in step 110 in FIG. 2A. The grouping process resultant data in each Channel boundary line is stored into a memory space which is previously obtained in memory 220.

The channel boundary terminal divider 224 is connected to a relative order determinator 226. The relative order determinator 226 shears in the process to be performed in step 112 in FIG. 2A. More specifically, the relative order determinator 226 sequentially extracts the above-mentioned pair of terminals from first and second boundary terminal groups Nu and Nd of the channel boundary line having a designated object (for example, line 16a as shown in FIG. 4) based on various data stored in memories 216, 218, and 220. Then, the relative positional relationship is affirmed to the signal wirings of the extracted pair of terminals in channel CH1. The result determined here is stored into memory 220.

When the wiring process to one channel boundary line is completed, the relative order determinator 226 transfers an electric signal showing the completion of process to controller 208 via a line 228. The controller 208 executes the determination shown in step 114 in FIG. 2A. In a case when the other unprocessed channel boundary line is remained on chip substrate 10, the designation of the boundary line and process execution commanding signal of the designation are supplied to the relative order determinator 226 via line 228. The relative order determinator 226 responses to the signal and executes the similar process in the designated channel boundary line.

A specified wiring processor 230 is connected to the above relative order determinator 226 and the detailed wiring process shown in steps 118, 120 and 122 under the control of controller 208. The final wiring design result produced herein is stored in memory 222 of data storage unit 212 via data bus 214. If one wishes to obtain such data by an operator's manual operation of keyboard unit 202, the automatic wiring design result data may be output from display unit 204 and/or image printer 206 under the control of controller 208.

Although the invention has been described with reference to a specific embodiment, it shall be understood by those skilled in the art that numerous modifications may be made that are within the spirit and scope of the invention.

In the above embodiment, as shown in FIG. 4, the signal transmission wirings, which are associated with each selected pair of channel boundary terminals, were arranged to run in the opposite direction to each other on the same wiring track in channel CH1. However, according to the present invention, in a case when one of the pair of selected terminals is a special wiring, such as a power source wiring, an earth wiring, or a clock signal line, it is allowed that one of the pair can be paired with a plurality of signal transmission wirings belonging to the group opposite thereto. In this case, one of the pair has a thick wiring width to cross over a plurality of tracks in channel CH1.

For example, as shown in FIG. 6, in a case when function block BL1 has a power source terminal 300, it is desirable that a a power source wiring 302 to be connected thereto be normally designated to be thicker than the signal transmission line. To increase current capacity, crossing point A1' of channel boundary line 16a and power source wiring 302 constitutes first group Nu together with channel boundary terminal A3. Similarly, channel boundary terminals B1 to B3 constitutes second group Nd. When terminal A1' is selected from first group Nu, a plurality of signal line B is selected from the other group Nd. For example, in this example, two terminals B1 and B2 are selected. In channel CH1, wiring tracks T1 and T2 are assigned to one power source line 302 to pair with two signal lines B1 and B2. Therefore, it is allowed that power source line 302 has a thick wiring width to cross over two tracks T1 and T2. With such an arrangement, in a case when a thick wiring is included in T-shaped crossing region, the wiring process can be effectively made in the minimized channel area.

What is claimed is:

1. An automatic wiring method for a semiconductor integrated circuit device wherein function blocks selected to provide a desired logical function are arranged on a substrate, and channels are defined as a wiring region around the function blocks, said method comprising the steps of:
    (a) providing tentative wirings between said function blocks in accordance with a connection requirement in said channels;
    (b) detecting crossing points of corresponding wirings in each of boundary lines of said channels, the detected crossing points being defined as channel boundary terminals;
    (c) specifying from said channels a certain pair of two neighboring channels which are coupled with each other so as to form a T-shaped crossing region, said two neighboring channels consisting of a first channel which is positioned between at least two corresponding function blocks and a second channel which is in contact at a boundary line with said first channel substantially at right angle thereby to form said T-shaped crossing region, said second channel extending in parallel with said channel boundary line;
    (d) selecting channel boundary terminals belonging to first and second terminal groups from said channel boundary terminals defined on said boundary line, said first terminal group including terminals connected with wirings which tend to run along a first direction in said second channel, said second terminal group including terminals connected with wirings which tend to run along a second direction opposite to said first direction in said second channel;

(e) sequentially selecting channel boundary terminals from said first and second groups, respectively, to obtain a pair of channel boundary terminals; and (f) assigning tracks to wirings associated with pairs of selected channel boundary terminals in said second channel in such a manner that each of said tracks is basically occupied with two wirings running thereon in the opposite directions to each other.

2. The method according to claim 1, wherein one track is assigned to two wirings associated with the selected each pair of terminals in said second channel in such a manner that said two wirings extending from said pair of terminals are allowed to run in the opposite directions to each other on said track.

3. The method according to claim 1, wherein said pair of terminals comprise a first channel boundary terminal intersecting a first wiring running in said first direction in said second channel, and a second channel boundary terminal intersecting a second wiring running in said second direction in said second channel and separating from said first channel boundary terminal along said second direction, said two wirings being defined so as to be prohibited from being overlapped each other on said wiring track.

4. The method according to claim 2, wherein, when said channel boundary terminals are divided into said first and second terminal groups, if an uncertain channel boundary terminal which does not belong to any groups is included in said channel boundary terminals, said uncertain channel boundary terminal is excluded from the objects of the grouping process.

5. The method according to claim 4, wherein said two wirings function as signal transmission lines of said integrated circuit device.

6. The method according to claim 4, wherein when one of said two wirings is one of a power wiring, an earth wiring, and a clock line, said one of two wirings is allowed to be paired with a plurality of signal wirings, said one of two wirings has a wiring width thick enough to occupy a plurality of wiring tracks in said second channel.

7. The method according to claim 5, wherein said function blocks include at least one of a processing unit and a memory unit.

8. The method according to claim 7, wherein said memory unit includes at least one of a random access memory and a read only memory.

9. The method according to claim 8, wherein said processing unit includes at least one of a programmable logic array, an arithmetic logic unit, and a central processing unit.

10. An automatic wiring method for a semiconductor integrated circuit device wherein function blocks selected to provide a desired logical function are arranged on a substrate, and channels are defined as a wiring region around the function blocks, said method comprising the steps of:

(a) providing tentative wirings between said function blocks in accordance with a connection requirement in said channels;

(b) detecting crossing points of corresponding wirings in each of boundary lines of said channels, the detected crossing points being defined as channel boundary terminals;

(c) specifying from said channels a certain pair of two neighboring channels which are coupled with each other so as to form a T-shaped crossing region, said two neighboring channels consisting of a first channel which is positioned between at least two corresponding function blocks and a second channel which is in contact at a boundary line with said first channel substantially at right angle thereby to form said T-shaped crossing region, said second channel extending in parallel with said channel boundary line;

(d) selecting channel boundary terminals belonging to first and second terminal groups from said channel boundary terminals defined on said boundary line, said first terminal group including terminals connected with wirings which tend to run along a first direction in said second channel, said second terminal group including terminals connected with wirings which tend to run along a second direction opposite to said first direction said second channel;

(e) sequentially selecting channel boundary terminals from said first and second groups, respectively, to obtain a pair of channel boundary terminals; and (f) assigning tracks to wirings associated with pairs of selected channel boundary terminals in said second channel in such a manner that each of said tracks is basically occupied with two wirings running thereon in the opposite directions to each other, and that, when one of said two wirings is one of a power supply line, a ground line, and a clock signal transmission line, said one of two wirings is allowed to be paired with a plurality of signal wirings.

11. The method according to claim 10, wherein said one of two wirings has a line width which is wide enough to occupy a selected number of wiring tracks in said second channel.

12. The method according to claim 11, wherein said one of two wirings includes a power supply line which has its line width substantially corresponding to two wiring tracks to be defined in said second channel.

13. The method according to claim 11, wherein said function blocks include at least one of a processing unit and a memory unit.

14. The method according to claim 13, wherein said memory unit includes one of a random access memory and a read only memory.

15. The method according to claim 14, wherein said processing unit includes one of a programmable logic array, an arithmetic logic unit, and a central processing unit.

* * * * *